United States Patent [19]
Takeda et al.

[11] 4,349,609
[45] Sep. 14, 1982

[54] ELECTRONIC DEVICE HAVING MULTILAYER WIRING STRUCTURE

[75] Inventors: Shiro Takeda, Sagamihara; Minoru Nakajima, Kawasaki, both of Japan

[73] Assignee: Fujitsu Limited, Kawasaki, Japan

[21] Appl. No.: 161,561

[22] Filed: Jun. 20, 1980

[30] Foreign Application Priority Data

Jun. 21, 1979 [JP] Japan .................................. 54/77557
Dec. 28, 1979 [JP] Japan .................................. 54/171005
Jan. 16, 1980 [JP] Japan .................................. 55/3288

[51] Int. Cl.$^3$ ............................................. B32B 17/06
[52] U.S. Cl. .................................. 428/429; 128/447; 556/450
[58] Field of Search ....................... 556/450, 451, 462; 428/429, 447

[56] References Cited

U.S. PATENT DOCUMENTS 4,103,045 7/1978 Lesaicherre .................... 428/429 X
4,273,420 6/1981 Watanabe ........................ 428/447 X Primary Examiner—David A. Simmons

[57] ABSTRACT

An improved electronic device having a multilayer wiring structure. An interlayer insulation layer or at least one of plural interlayer insulation layers, formed between metal wiring layers, is comprised of a cured coating of a ladder-type silsesquioxane polymer. A layer for protecting a metal wiring layer or layers may also be comprised of a cured coating of a similar polymer. The specified cured coating exhibits good resistance to heat and moisture and enhanced levelling on a pattern.

20 Claims, 29 Drawing Figures

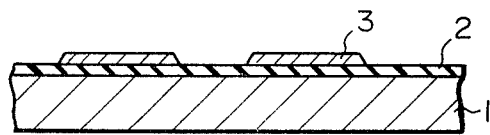
Fig. IA
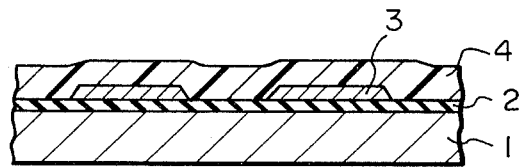
Fig. IB
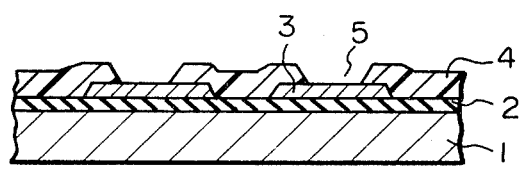
Fig. IC
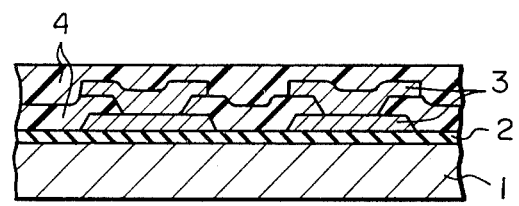
Fig. ID
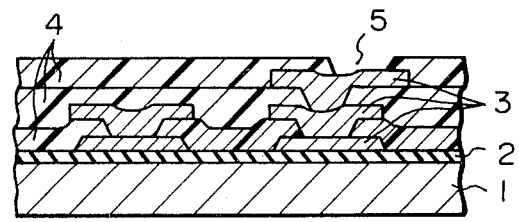
Fig. IE

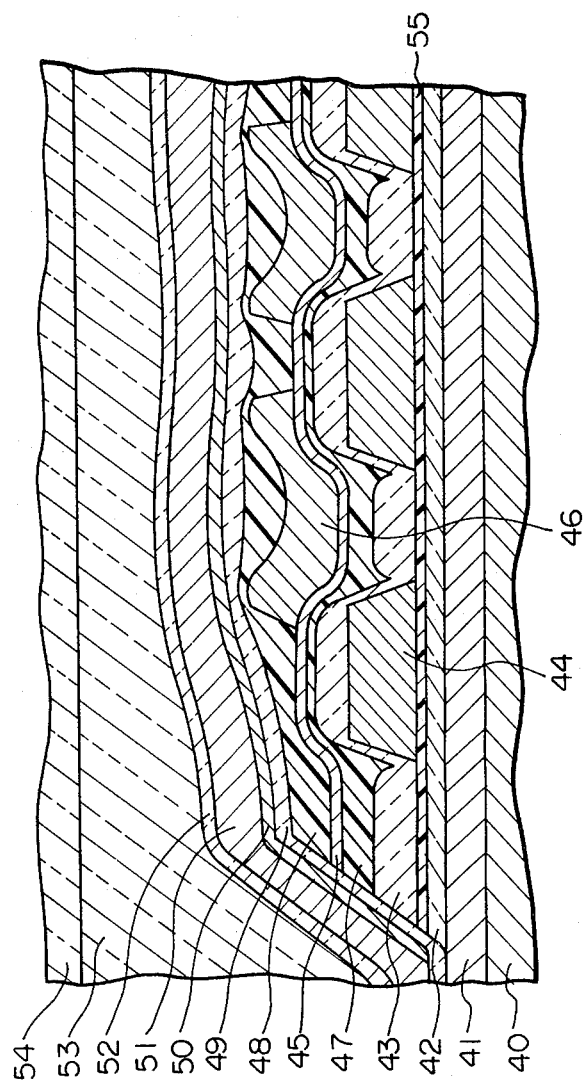

ELECTRONIC DEVICE HAVING MULTILAYER WIRING STRUCTURE

BACKGROUND OF THE INVENTION (1) Field of the Invention

This invention relates to an improved electronic device having a multilayer wiring structure wherein the interlayer insulation layer or layers formed therein are comprised of a silsesquioxane polymer.

(2) Description of the Prior Art

A thermosetting polyimide resin has been heretofore widely used as an insulation layer-forming material for electronic devices having a multilayer wiring structure, such as semiconductor devices and bubble memory devices. Although the thermosetting polyimide resin exhibits good thermal resistance, i.e., resists a temperature of 450° C. for one hour, it has poor adhesion to a protective layer (silicon oxide or silicon nitride) of a semiconductor device and sufficient moisture resistance cannot be guaranteed. Furthermore, the thermosetting polyimide resin exhibits a poor levelling on a pattern.

SUMMARY OF THE INVENTION

It is, therefore, a primary object of the present invention to provide electronic devices having a multilayer wiring structure, such as semiconductor devices, thin film magnetic head and bubble memory devices, which devices are highly reliable in view of their good resistance to heat and moisture. More particularly, the present invention is to provide an interlayer insulation layer or layers formed in the multilayer wiring structure, which layer or layers exhibit good resistance to heat and moisture and enhanced levelling on a pattern.

Other objects and advantages of the present invention will be apparent from the following description.

In accordance with the present invention, there is provided an improved electronic device having a multilayer wiring structure which comprises (a) a substrate having formed thereon a first metal layer of wiring, and (b) an interlayer insulation layer comprised of a ladder-type organopolysiloxane, formed on the substrate and having formed thereon a second metal layer of wiring.

BRIEF DESCRIPTION OF THE DRAWINGS

FIGS. 1A through 1E schematically illustrate, in cross-section, the sequential steps of manufacturing a semiconductor device;

DESCRIPTION OF THE PREFERRED EMBODIMENTS

Figure 2A:
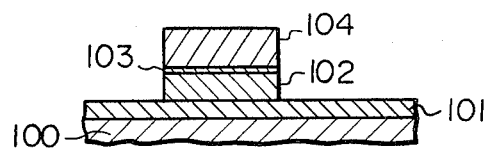
FIGS. 2A through 2G schematically illustrate, in cross-section, the sequential steps of manufacturing a bubble memory device according to prior art.

The term "ladder-type silsesquinoxane polymer" is used in this specification to mean an organopolysiloxane which possesses a ladder-type molecular structure represented by the chemical formula:

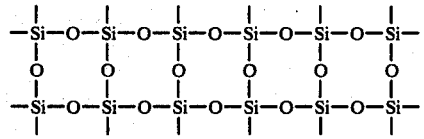

The ladder-type silsesquioxane polymer is characterized in that the ratio of the number of silicon atoms to the number of oxygen atoms is about 1:1.5 and the ratio of the number of silicon atoms to the number of side chains is about 1:1. Preferable ladder-type silsesquioxane polymers are represented by the structural formula:

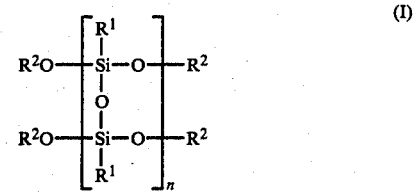

wherein each $R^2$ is independently hydrogen, methyl, ethyl or propyl, each $R^1$ is independently methyl, ethyl, phenyl, chlorophenyl or bromophenyl, and part of the $R^1$ groups may be replaced by hydroxyl, methoxy or ethoxy, and n is an integer sufficient to provide a molecular weight of from about 1,000 to about 1,000,000, preferably from about 1,500 to about 200,000. It is preferable that at least one half of the side chains $R^1$ be methyl groups and the remainder of the side chains $R^1$ be ethyl, phenyl, chlorophenyl, hydroxyl, methoxy or ethoxy groups. More preferably, all of the side chains $R^1$ are methyl groups, or at least one half of the side chains $R^1$ are methyl groups and the remainder of the side chains $R^1$ are phenyl groups. The terminal groups $R^2$ of the silsesquioxane polymer used in the present invention are reactive with each other and, when the silsesquioxane polymer is cured, the $R^2$s react with each other to produce $R^2OR^2$ as follows.

The ladder-type silsesquioxane polymer per se is known. For example, ladder-type silsesquioxane polymers having a relatively high molecular weight, and the process for the preparation thereof, are disclosed in Japanese Laid-Open Patent Application Specifications No. 139900/75 and No. 88099/78. Ladder-type silsesquioxane polymers having a relatively low molecular weight are marketed as glass resins under tradenames of "GR #100" and "GR #650" by Owens-Illinois Glass Co. Specific examples of the ladder-type silsesquioxane polymer having the above-mentioned formula (I) are:

---

(a) $R_1 = -CH_3$ and phenyl ($-CH_3$/phenyl $= 2/1$), $R_2 = -C_2H_5$ and hydrogen ($-C_2H_5/H = 2/1$), average molecular weight $\overline{Mn} = 1{,}200$ to $15{,}000$;
(b) $R_1 = -CH_3$, $R_2 = -C_2H_5$ and H, average molecular weight $\overline{Mn} = 1{,}300$ to $15{,}000$;
(c) $R_1 = -CH_3$ and phenyl ($-CH_3$/phenyl $= 1/1$), $R_2 = H$, average molecular weight $\overline{Mn} = 1{,}500$;
(d) $R_1 = -CH_3$, $R_2 = H$, average molecular weight $\overline{Mn} = 9{,}000$ to $200{,}000$,
(e) $R_1 =$ phenyl, $R_2 = H$, average molecular weight $\overline{Mn} = 1{,}200$.

---

The ladder-type silsesquioxane polymer can be applied onto a substrate having formed thereon a metal wiring layer in the form of a coating solution. Solvents used for the preparation of the coating solution include, for example, aromatic and aliphatic hydrocarbons, such as toluene and cyclohexane; cellosolves, such as methyl cellosolve acetate, and; alcohols and ketones. Although the suitable concentration of the silsesquioxane polymer in the coating solution varies depending upon the molecular weight of the silsesquioxane polymer, the solvent and the electronic device, the concentration of the silsesquioxane polymer is usually below 50% by weight. The coating process may be conducted by spin coating and other conventional coating techniques.

A coating film of the silsesquioxane polymer formed on the substrate having formed therein a metal wiring layer may be cured in a conventional manner, for example, at a temperature of at least approximately 230° C. for at least about two hours in a nitrogen atomosphere. The curing temperature is preferably the highest temperature to which the electronic device is exposed and is usually in the range of from about 300° to about 450° C.

The ladder-type silsesquioxane polymer may be used either alone or in combination with other resins. Preferable resins to be incorporated with the ladder-type silsesquioxane polymer are:
 (i) silanol compounds represented by the following formula (II) or (IV):

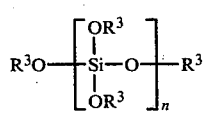 (II)

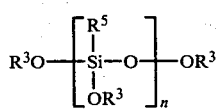 (IV)

wherein each $R^3$ is independently hydrogen or an alkyl group having 1 to 3 carbon atoms, $R^5$ is an organic residue and n is an integer of at least 1;
 (ii) titanol compounds represented by the formula:

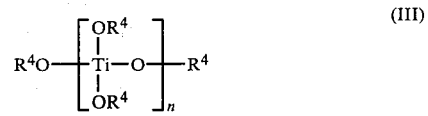 (III)

wherein each $R^4$ is independently an alkyl group having 3 to 6 carbon atoms and n is an integer of at least 1.

The $R^5$ in the formula (IV) is preferably an alkyl group having 1 to 6 carbon atoms, such as a methyl or ethyl group; an alkenyl group having 2 to 6 carbon atoms, such as a vinyl or allyl group; or a substituted or unsubstituted phenyl group.

The integer "n" in the formulae (II), (IV) and (III) is preferably such that the number average of the molecular weights $\overline{Mn}$ of the respective compounds is not larger than approximately 10,000.

It is also possible that the silsesquioxane polymer is in the form of a copolymer comprised of silsesquioxane units represented by the formula (I) and silanol compound units represented by the formula (II) or (IV), and/or titanol compound units represented by the formula (III).

The silanol compound of the formula (II) and the titanol compound of the formula (III) are, when heated to a high temperature, converted to a silicon oxide and a titanium oxide, respectively. The silanol compound of the formula (IV) (wherein n=1) is the same as the raw material used for the preparation of the silsesquioxane polymer, but does not possess a ladder-type structure.

The use of the polymer mixture of the ladder-type silsesquioxane polymer with the silanol or titanol compound of the formula (II), (IV) or (III), or the copolymer of the ladder-type silsesquioxane with the silanol or titanol compound of the formula (II), (IV) or (III) is generally advantageous over the use of the ladder-type silsesquioxane polymer alone, for reasons now set forth.

First, the coating film of a ladder-type silsesquioxane polymer is liable to crack when heated at a high temperature. The formation of cracks becomes substantial with an increase of the coating thickness. For example, when the coating film of a ladder-type silsesquioxane polymer is allowed to stand at a temperature of 450° C. in a nitrogen atmosphere for one hour, the permissible maximum coating thickness at which no crack is formed is 1.1 microns. The permissible maximum coating thickness of a polydialkoxysilane (i.e., a silanol compound of the formula (II)) is 0.5 micron. In contrast, the permissible maximum coating thickness of the polymer mixture of a ladder-type silsesquioxane polymer with a polydialkoxysilane can be about 2.1 microns at maximum. The permissible maximum coating thickness of the copolymer of a ladder-type silsesquioxane with a silanol compound of the formula (II) can be about 2.5 microns. If the coating film is allowed to stand at a temperature of 400° C. or lower, the permissible maximum coating thickness is larger.

Furthermore, when the coating film of a ladder-type silsesquioxane polymer is exposed to air at a high temperature (e.g. 450° C.) or to an oxygen plasma, the coating film is liable to be oxidized and thus crack. This tendency is reduced in the above-mentioned polymer mixture or copolymer.

Secondly, the coating film prepared from the above-mentioned polymer mixture or copolymer exhibits, when cured, a crosslink density larger than that of the silsesquioxane homopolymer. Thus, the former coating film has enhanced mechanical properties and scratch resistance. Particularly, when a polydialkoxysilane is used in combination with the ladder-type silsesquioxane, the resultant coating film possesses a low coefficient of linear expansion and is very hard.

Thirdly, the coating film prepared from the above-mentioned polymer mixture or copolymer exhibits a good adhesion to an inorganic layer, such as a metal layer or a $SiO_2$ layer, to be formed on the coating film. This adhesion is far larger than that of the coating film prepared from the silsesquioxane homopolymer.

Fourthly, the thermal resistance of the coating film prepared from the polymer mixture or the copolymer is greater than that of the coating film prepared from the homopolymer. For example, thermal degradation temperatures of poly-methylphenylsilsesquioxane and poly-methylsilsesquioxane are 460° to 480° C. and 700° to 740° C., respectively. By the combination of polydialkoxysilane therewith, these thermal degradation temperatures can be raised to about 520° C. and about 755° C., respectively.

The proportion of the ladder-type silsesquioxane to the silanol or titanol compound in the polymer mixture or the copolymer may suitably be determined depending upon the molecular weight of the silsesquioxane polymer and the intended properties of the resulting coating film. In general, the polymer mixture or the copolymer may contain at least 30% by weight, more preferably 40 to 70% by weight, of the polymerized ladder-type silsesquioxane and not larger than 70% by weight, more preferably 30 to 60% by weight, of the silanol or titanol compound of the formula (II), (IV) or (III). For example, when a silsesquioxane polymer having a Mn of about 1,000 to 2,000 is blended with a polydialkoxysilane, the proportion of these polymers is preferably from 6/4 to 4/6 by weight. When a silsesquioxane polymer having a Mn of about 5,000 to 10,000 is blended with a polydialkoxysilane, the proportion of these polymers is preferably from 7/3 to 5/5 by weight. One preferable copolymer is prepared by a process wherein a mixture comprised of 80 to 90% by weight of a silsesquioxane polymer having a Mn of about 1,000 to 2,000 and 10 to 21% by weight of a polydialkoxysilane is dissolved in ethanol to obtain a solution having a concentration of 10% by weight; the solution is heated at a temperature of 80° C. for 90 minutes and then at a temperature of 90° C. for 30 minutes under reflux to effect copolymerization; the solution is cooled to ambient temperature and, then, the solvent is replaced by n-butyl cellosolve acetate; finally, a polydialkoxysilane is incorporated with the solution thereby to obtain a solution containing 30 to 60% by weight of the polymerized silsesquioxane and 40 to 70% by weight of polydialkoxyflulane.

Preferable solvents used for the preparation of a solution of the polymer mixture or the copolymer are methyl cellosolve acetate, ethyl cellosolve acetate and butyl cellosolve acetate. If desired, a minor proportion of butanol may be used in combination with these solvents.

The above-mentioned polymer mixture or copolymer may have incorporated therein a minor amount of a phosphorus compound. A phosphorus compound functions as a getter of cation impurities such as Li, Na and K. The amount of the phosphorus compound is usually in the range of from 100 to 50,000 ppm, more preferably from 100 to 10,000 ppm, expressed in terms of phosphorus. Phosphorus-doped polydialkoxy or -dihydroxysilanes are commercially available, and include, for example, ACCUSPIN (Trade name, for P-doped polydiethoxyhydroxysilane supplied by Allied Chemical Co.) and CLD (trade name, for P-doped polydihydroxysilane supplied by Tokyo Oka K.K.). It is presumed that phosphorus is present in these polydialkoxy(or -dihydroxy)silanes in the form of $P_2O_5$.

When a ladder-type silsesquioxane polymer which is used has a relatively large molecular weight, 3 to 20% by weight of a plasticizer may be incorporated therein in order to impart flexibility to the polymer. A plasticizer having good thermal resistance, such as a product obtained by ring opening polymerization of tetrahydrofuran, is preferably used.

In the preparation of an electronic device of a multi-layer wiring structure, the interlayer insulation layer or layers are made of a ladder-type silsesquioxane polymer as follows. That is, of one or more interlayer insulation layers is made of either (i) only the silsesquioxane polymer, or (ii) a combination of a layer of the silsesquioxane polymer and a layer of an inorganic oxide superposed upon or beneath the silsesquioxane polymer layer. A suitable constitution of the interlayer insulation layer may be determined depending upon (i) the particular substrate (particularly, its coefficient of thermal expansion), (ii) the thickness of the insulation layer, (iii) the particular matal conductor, the wiring pattern layer of which is formed upon the insulation layer, (iv) the highest temperature which the electronic device is to encounter, (v) the particular manner in which the insulation layer is etched and (vi) the particular material used for the protection of the metal conductor patterned wiring layer formed on the insulation layer. For example, when at least one of the following conditions is satisfied, it is preferable that each interlayer insulation layer be made of only the silsesquioxane polymer. That is, (i) the substrate has a coefficient of thermal expansion of at least about $5 \times 10^{-5}$/deg., (ii) the interlayer has a thickness of not greater than 2.0 microns, and (iii) the highest temperature which the electronic device is to encounter is not higher than about 400° C. When all of the three conditions are not satisfied, it is preferable to form an inorganic layer in addition to the silsesquioxane polymer layer between the metal conductor wirings. The inorganic oxide may be selected from, for example, $Al_2O_3$, $SiO_2$, P-doped $SiO_2$ (PSG), $Cr_2O_3$, and $TiO_2$.

In the process of preparing the multi-layer wiring structure, the etching of the silsesquioxane polymer may be carried out by either a dry type or wet type procedure. In a wet type etching procedure, an $NH_4F$/HF etchant is preferably used. When the silsesquioxane polymer layer formed on an Al conductor wiring is etched, it is preferable to etch the polymer layer with an $NH_4$/F/HF/ethylene glycol etchant and, then, to rinse the Al conductor wiring with an aqueous dilute solution of $NH_4$/F/HF/$HNO_3$. By this procedure, formation of the residue of the silsesquioxane polymer and the corrosion of the Al conductor can be avoided. Instead of using the $NH_4F$/HF/$HNO_3$ rinsing solution, a dry etching (plasma asher) may be utilized.

Suitable dry type etching procedures include ion milling and plasma etching. The ion milling can be readily carried out provided that the etching rates of the resist and the silsesquioxane polymer are precisely determined. The plasma etching can be advantageously carried out by using a gaseous mixture comprised of a fluorinated hydrocarbon, such as $CHF_3$, $CF_4$ or $C_3F_8H_2$, and molecular oxygen. In the plasma etching, the resistance of the resist to the plasma and the resistance of the silsesquioxane polymer to crack formation should be taken into consideration. It has now been found that a gaseous mixture comprised of at least 70% by volume of molecular oxigen is suitable for etching the silsesquioxane polymer, and a gaseous mixture comprised of not more than 50% by volume, preferably not more than 25% by volume, of a fluorinated hydrocarbon and at least 50% by volume, preferably at least 75% by volume, of molecular oxygen is suitable for removing the resist. Furthermore, when the hereinbefore mentioned polymer mixture or copolymer is used, a mixture comprised of at least 30% by volume of a fluorinated hydrocarbon and not more than 70% by volume of molecular oxygen, and a mixture comprised of not more than 10% by volume of a fluorinated hydrocarbon and at least 90% by volume of molecular oxygen are advantageously used for the polymer etching and the resist removal, respectively.

When a mixture of at least 90% by volume of molecular oxygen and the balance of a fluorinated hydrocarbon is used, the silsesquioxane polymer layer tends to crack. However, this crack formation can be avoided by forming an inorganic oxide layer of 300 to 2,000 angstroms in thickness on the silsesquioxane polymer layer. The inorganic oxide includes, for example, $SiO_2$, $Al_2O_3$, $Cr_2O_3$ and $TiO_2$. Of these, $SiO_2$, and particularly sputtered $SiO_2$ is preferable.

In the case where a magnetic material, the magnetic properties of which tend to change readily, such as permalloy, is formed on the silsesquioxane polymer layer, it is preferable that the silsesquioxane polymer layer be previously cured at least under conditions of 450° C. and one hour, or a Ti or Ta layer of 200 to 1,000 angstroms in thickness be formed between the silsesquioxane polymer layer and the magnetic material layer. The formation of a Ta layer is optimum. It is presumed that Ti and Ta desirably adsorb trace amounts of gases generated from the silsesquioxane polymer when a permalloy is deposited thereon. Thus, one preferable electronic device having a permalloy layer or layers, such as a bubble memory device, has a structure such that a $SiO_2$ layer of 300 Angstroms in thickness and a Ta layer of 300 Angstroms in thickness are in turn formed on the silsesquioxane polymer layer, and the permalloy layer is formed on the Ta layer. Furthermore, in the case where a permalloy layer is protected by a ladder-type silsesquioxane polymer it is preferable that a $SiO_2$ layer of 500 to 2,000 Angstroms in thickness be formed on the protecting silsesquioxane polymer layer. The $SiO_2$ layer prevents the permalloy from being oxidized when exposed to air at a temperature of at least 350° C.

As mentioned above, although a coating of the ladder-type silsesquioxane polymer exhibits good adhesion to a priming metal or inorganic oxide coating, it exhibits rather poor adhesion to a metal or inorganic oxide coating to be overcoated thereon. It now has been found that the adhesion of the ladder-type silsesquioxane polymer coating to the overcoated metal or inorganic oxide layer can be enhanced by interposing a coating of the hereinbeforementioned silanol or titanol compound between the silsesquioxane polymer coating and the overcoated metal or inorganic oxide layer. The formation of the silanol or titanol compound coating on the silsesquioxane polymer coating is preferably carried out by applying a solution of the silanol or titanol compound onto the silsesquioxane polymer coating before the silsesquioxane polymer coating has been completely cured, i.e., while the silsesquioxane polymer still possesses unreacted terminal groups.

Typical methods of manufacturing electronic devices having a multilayer wiring structure wherein the insulation layer or layers are made of a ladder-type silsesquioxane polymer will now be illustrated with reference to the accompanying drawings, by the following examples.

EXAMPLE 1

Examples 1 through 3 illustrate the manufacture of semiconductor devices with reference to FIGS. 1A through 1E.

A monomethylsilsequioxane polymer corresponding to the formula (I) ($R^1=-CH_3$, $R^2=H$), and having an average molecular weight of about 30,000 was dissolved in a mixed solvent of cyclohexanone and toluene (mixing volume ratio=about 2:1) to obtain a varnish having a concentration of about 25% by weight. One silicon wafer 1 having a diameter of about 2 inches, which had built-in circuit elements having predetermined portions thereof exposed (the nonexposed portion was coated with a insulating film 2 of silicon dioxide or the like), was prepared, and an aluminum wiring layer 3 of a predetermined pattern having a thickness of about one micron and a width of about four microns was formed on the side of the circuit elements (see FIG. 1A).

The above-mentioned varnish was spin-coated on the wiring layer 3 at a rotation rate of 4,000 rpm and was cured at 300° C., in a nitrogen atmosphere, for 60 minutes. Then, the varnish was coated and cured again under the same conditions as described above. Furthermore, curing was carried out at 350° C. for 30 minutes (see FIG. 1B). Reference numeral 4 represents a cured silsequioxane polymer layer. The coating thickness of monomethylsilsesquioxane polymer was 1.6 microns expressed in terms of the thickness obtained when coated on a flat plate and then cured. The actual thickness of the cured monomethylsilsesquioxane polymer coating was 0.85 micron on aluminum lines. Thus, the difference in height of the cured coating between the portions on the film 2 in the aluminum lines 3 and those on the space not covered by lines 3 was only 0.10 micron. This shows that the monomethylsilsesquioxane polymer has a very good levelling effect. Furthermore, it is to be noted that, since the monomethylsilsesquioxane polymer has a dielectric constant of 2.8, the space between the parallel aluminum lines can be reduced to 0.85 micron. This is in a striking contrast to a conventional semiconductor device having the insulation layer or layers made of $SiO_2$, wherein the space between the parallel aluminum lines must be 1.0 micron or more.

Contact holes 5 were formed on the cured silsesquioxane polymer layer by using a resist and a fluoric acid type etching solution (see FIG. 1C).

The above-mentioned procedures were repeated to obtain semiconductor devices shown in FIGS. 1D and 1E.

The bipolar element having two wiring layers and two silsesquioxane polymer layers (one being an interlayer insulation layer and the other being a protection layer), and having a structure similar to that shown in FIG. 1D was allowed to stand at a temperature of 200° C. for 1,000 hours. The bipolar element was further subjected to a pressure-cooker test wherein the element was exposed to steam at a temperature of 120° C. and a pressure of 2 atm. No change was observed in the bipolar element.

EXAMPLE 2

The procedures described in Example 1 were repeated wherein a varnish containing 35% by weight of a monomethylsilsesquioxane polymer corresponding to the formula (I) ($R^1$=—$CH_3$, $R^2$=H) and having a number average molecular weight of about 9,000, and a varnish containing 18% by weight of a monomethylsilsesquioxane polymer corresponding to the formula (I) ($R^1$=—$CH_3$, $R^2$=H) and having a number average molecular weight of about 100,000 were separately used. The results were similar to those obtained in Example 1.

EXAMPLE 3

A polysiloxane having a number average molecular weight of about 1,000, in which the number of side chains was about 1.0 per Si atom, ⅔ of the side chains were methyl groups, ⅓ of the side chains were phenyl groups, the number of terminal groups was about 4.0 per molecule, ⅔ of the terminal groups were hydroxyl groups and ⅓ of the terminal groups were ethoxy groups, was dissolved in a mixed solvent of n-butyl cellosolve acetate and toluene (mixing volume ratio=1:2) to obtain a varnish having a polysiloxane concentration of 30% by weight. A silicon wafer having an aluminum wiring layer 3 was prepared in the same manner as described in Example 1 (see FIG. 1A), and the varnish was spin-coated on the wiring layer 3 at a rotation number of 4,000 rpm and was cured in a nitrogen atmosphere at 90° C. for 30 minutes, at 170° C. for 1 hour and, further, at 250° C. for 1 hour. The varnish was coated and cured again under the same conditions as described above (see FIG. 1B). Resist coating and patterning were carried out and, then, plasma dry etching was carried out to form contact holes 5 (see FIG. 1C). The above-mentioned procedures were repeated to obtain semiconductor devices illustrated in FIGS. 1D and 1E.

EXAMPLE 4

This example illustrates that the levelling of a ladder-type silsesquioxane polymer on a wiring pattern is dependent upon the particular silsesquioxane polymer used.

Each of the silsesquioxane polymers, listed in Table I, below, was dissolved in a mixed solvent shown in Table II, below, to prepare a coating solution. The concentration of the silsesquioxane polymer in each solution was 8% to 40% by weight. Each solution was spin-coated, by using a spinner, on a silicon wafer having formed thereon an aluminum wiring pattern 0.9 micron in height and 5 microns in width. The coating film was cured under conditions shown in Table II, below.

For comparison purposes, cured coating layers were formed from a condensation polymerization type polyimide ("PIQ" supplied by Hitachi Chemical Co.) and from polyphenylquinoxaline (hereinafter referred to as "PPQ" for brevity).

TABLE I

| Specimen resin* | Substituents | Terminal groups | $\overline{Mw}$ | $\overline{Mw}/\overline{Mn}$ |
|---|---|---|---|---|
| PLOS-1 | Phenyl | —OH, —$OC_2H_5$ | $2.1 \times 10^3$ | 1.8 |
| PLOS-2 | Phenyl, | —OH, | $9.2 \times 10^3$ | 5.8 |

TABLE I-continued

| Specimen resin* | Substituents | Terminal groups | $\overline{Mw}$ | $\overline{Mw}/\overline{Mn}$ |
|---|---|---|---|---|
| PLOS-3 | —$CH_3$ | —$OC_2H_5$ —OH, —$OC_2H_5$ | $1.7 \times 10^4$ | 5.9 |
| PLOS-4 | —$CH_3$ | —OH | $4.9 \times 10^4$ | 3.7 |
| PLOS-5 | —$CH_3$ | —OH | $9.6 \times 10^4$ | 3.9 |
| PLOS-6 | —$CH_3$ | —OH | $8.5 \times 10^4$ | 2.7 |
| PPQ | — | — | $1.6 \times 10^5$ | 7.1 |
| PI | — | — | — | — |

*PLOS = Ladder-type silsesquioxane polymer
PPQ = Polyphenylquinoxaline
PI = Thermosetting type polyimide

TABLE II

| Specimen resin | Composition of mixed solvent (W/W) | Pre-curing | curing |
|---|---|---|---|
| PLOS-1,3 | Isophorone/toluene = 3/7 | 170° C., 3 hr | 250° C., 1 hr |
| PLOS-2 | BCA/toluene = ½ or isophorone/toluene = 3/7*¹ | 170° C., 3 hr | 250° C., 1 hr |
| PLOS-4,5,6 | Isophorone/toluene = 3/7 | — | 350° C., 1 hr |
| PPQ | M-cresol | 300° C., 1 hr | 400° C., 1 hr |
| PIQ | NMP/DMAC = 1/1*² | 220° C., 1 hr | 350° C., 1 hr |

Figure 4:
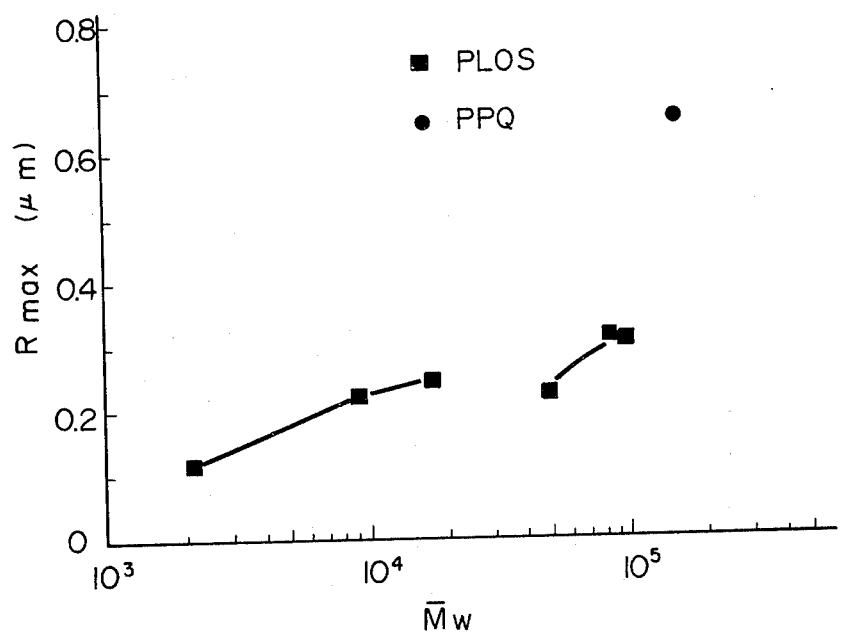
FIG. 4 is a graph showing the dependence of the levelling effect of coating films upon the average molecular weight of the organo polysiloxane resins used.

*¹Isophorone/toluene = 3/7 was used when the dependency of the levelling effect upon the molecular weight of the polysiloxane was tested. Butyl cellosolve acetate (BCA)/toluene = ½ was used in the other tests.
*²NMP = N-methyl-2-pyrrolidone
DMAc = N,N-dimethylacetamide When the cured coating layer had a thickness of one micron, the film exhibited a film surface undulation of 0.12 to 0.3 micron on the line-and-space pattern as illustrated in FIG. 4. In FIG. 4, the ordinate and the abscissa represent, respectively, the film surface undulation Rmax (in microns) on the line-and-the-space pattern and the average molecular weight $\overline{Mw}$. The plots therein show that the levelling effect of a ladder-type silsesquioxane polymer (PLOS) decreases with an increase of the average molecular weight.

Figure 5:
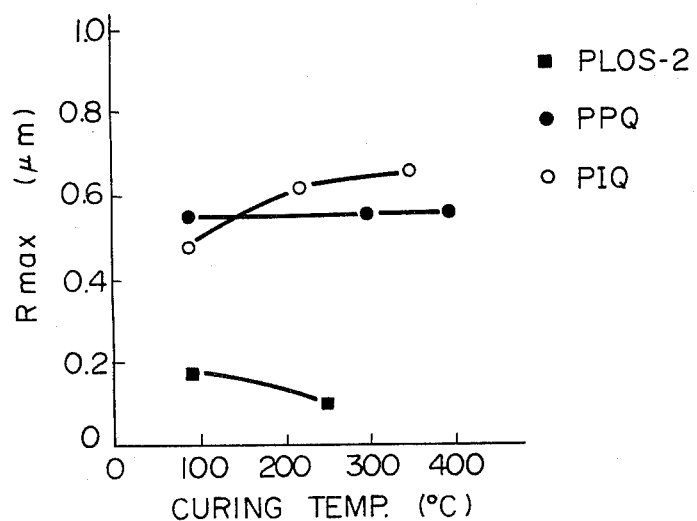
FIG. 5 consists of graphs showing the dependence of the levelling effect of coating films upon the curing temperature of the films.

When the coating film of two microns in thickness was formed and, then, the coating film was cured, the dependency of the film surface undulation on the line-and-space pattern upon the curing temperature was tested. The results are shown in FIG. 5. The curves in FIG. 5 show that, with an increase of the curing temperature, the levelling effect of the silsesquioxane polymer (PLOS-2) increases although only to a minor extent. By comparison, the levelling effect of the polyphenyl-quioxaline (PPQ) is approximately constant and that of the condensation polymerization type polyimide (PIQ) decreases, with an increase of the curing temperature.

Figure 6:
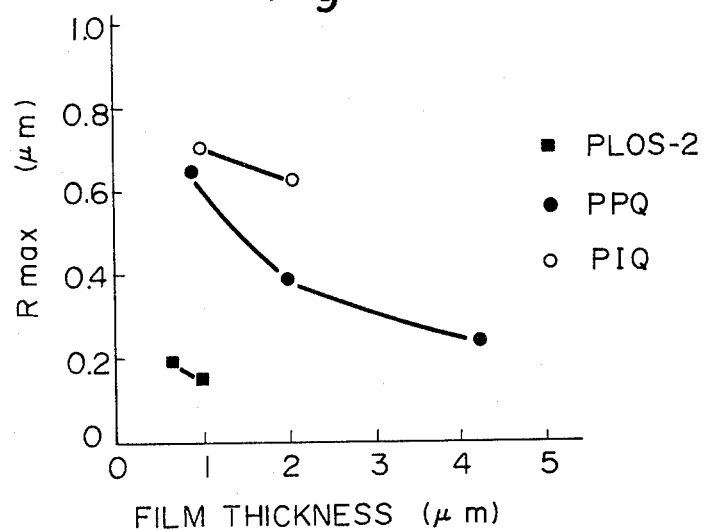
FIG. 6 consists of graphs showing the dependence of the levelling effect of coating films upon the film thickness.

When coating films of various thicknesses were formed, the dependency of the film surface undulation on the line-and-space pattern upon the film thickness was tested. The results are shown in FIG. 6. The curves in FIG. 6 show that the levelling effect increases with an increase of the film thickness.

As is seen from the above-mentioned results, a ladder-type silsesquioxane polymer exhibits enhanced levelling on a pattern as compared with a condensation polymerization type polyimide (PIQ) and polyphenyl-quinoxaline (PPQ). When the ladder-type silsesquioxane polymer coating film having a thickness of one micron is formed on an aluminum pattern having a thickness of 0.9 micron, the maximum film surface undulation can be reduced to about 0.2 micron.

The enhanced levelling effect of the ladder-type silsesquioxane polymer will now be illustrated with reference to FIGS. 9A through 9F.

Figure 9A:
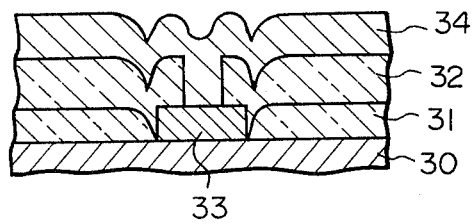
FIG. 9A schematically illustrates, in cross-section, a portion of an electronic device according to prior art.

Referring to FIG. 9A, which schematically illustrates, in cross-section, a portion of an electronic device according to prior art, wedge-shaped gaps are inevitably formed between a first metal conductor wiring 33 and a first insulation layer 31 in the lift-off step. Similar wedge-shaped gaps are formed in a second insulation layer 32 and also in a second metal conductor wiring layer 34. This tends to cause contact failure in the wedge-shaped gap portion of the second metal conductor wiring 34.

Figure 9B:
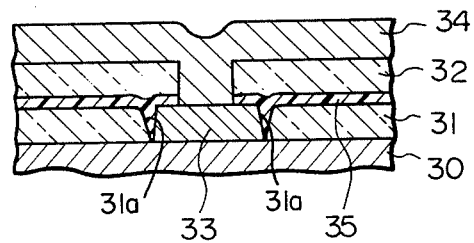
FIGS. 9B through 9F schematically illustrate, in cross-section, portions of electronic devices according to the present invention.

Referring to FIG. 9B, wedge-shaped gaps 31a inevitably formed between a first metal conductor wiring 33 and a first insulation layer 31 in the lift-off step are filled with a ladder-type silsesquioxane polymer 35. No wedge-shaped gaps are formed in the second insulation $SiO_2$ layer 32 or in the second metal conductor layer 34.

Figure 9C:
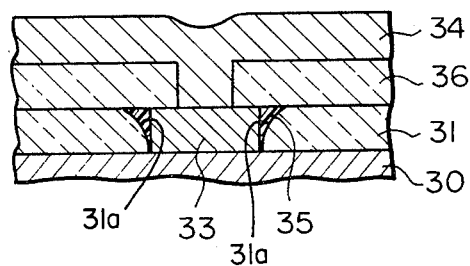

Referring to FIG. 9C, wedge-shaped gaps 31a formed between a first metal conductor wiring 33 and a first insulation layer 31 in the lift-off step are filled up with a ladder-type silsesquioxane polymer 35 as explained with reference to FIG. 9B, and then, the so formed layer of the silsesquioxane polymer 35 is light-etched by means of ion-milling.

Figure 9D:
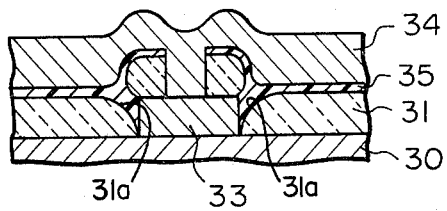

Referring to FIG. 9D, wedge-shaped gaps 31a formed between a first metal conductor wiring 33 and a first insulation $SiO_2$ layer 31 by a procedure other than a lift-off procedure are filled with the silsesquioxane polymer 35.

Figure 9E:
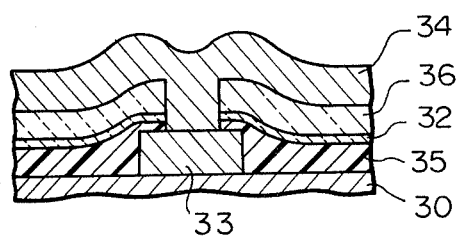

Referring to FIG. 9E, a coating layer 35 of a ladder-type silsesquioxane polymer is formed on a substrate 30 and a first metal conductor wiring 33 and is cured. After that, a $SiO_2$ layer having a thickness of 0.1 micron is formed thereon by means of sputtering, and then, a PSG layer (i.e., a phosphorus-doped glass layer formed by means of chemical vapor deposition) 36 is formed thereon.

Figure 9F:
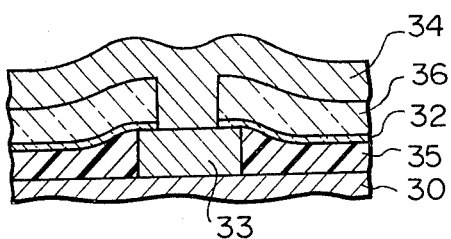

Referring to FIG. 9F, the coating layer 35 of a ladder-type silsesquinoxane polymer illustrated in FIG. 9E is subjected to plasma light-etching employing a reactive gas $CF_4/O_2(5\%)$, whereby the uppermost portion of the coating layer 35 is removed. After that, a thin $SiO_2$ layer 32, a PSG layer 35 and, then, a second metal conductor wiring 34 are in turn formed thereon.

EXAMPLE 5

This example illustrates the manufacture of a magnetic bubble chip used for a magnetic bubble memory device. In the first half of this example, the manufacture of a magnetic bubble chip according to prior art is illustrated with reference to FIGS. 2A through 2G.

Figure 2B:
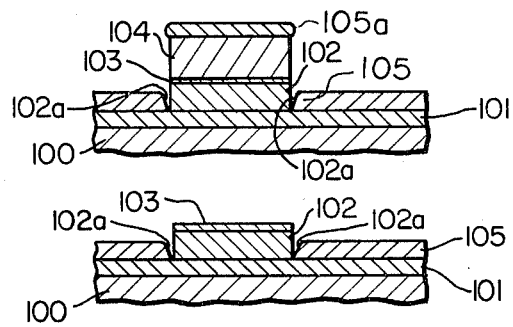
Figure 2C:
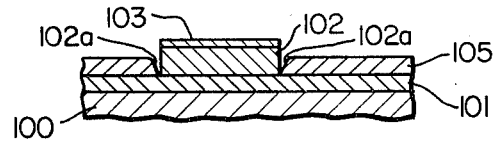

At first, as illustrated in FIG. 2A, a $SiO_2$ layer 101 was formed on a substrate 100 by sputtering and a layer 102 of Al was coated on the layer 101 by vacuum evaporation deposition. Then, a thin reflection-preventing layer 103 of $Cr_2O_3$ having a thickness of about 200 Angstroms was formed on the so formed Al conductor layer 102. A resist was coated, exposed to light, washed, fixed and etched to give predetermined shapes to the conductor layer 102 and $Cr_2O_3$ layer 103. Then, as illustrated in FIG. 2B, SiO layers 105 and 105a were formed on the entire surface by vacuum evaporation deposition, and as illustrated in FIG. 2C, ultrasonic wave treatment was carried out in acetone to remove the resist layer 104 and the SiO layer 105a on the resist layer 104 (this step is called the "lift-off" step). Thus, the conductor layer 102 was embedded in the SiO layer 105 to effect so-called planar leveling.

Figure 2D:
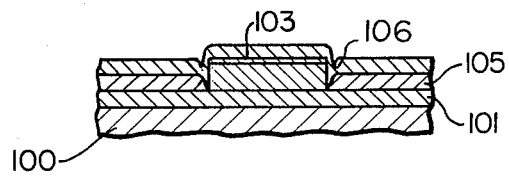
Figure 2E:
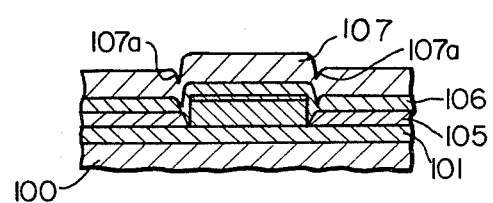
Figure 2F:
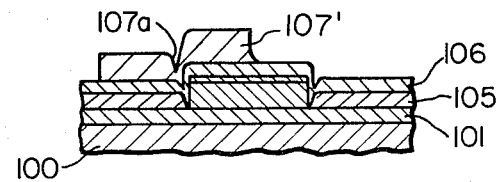
Figure 2G:
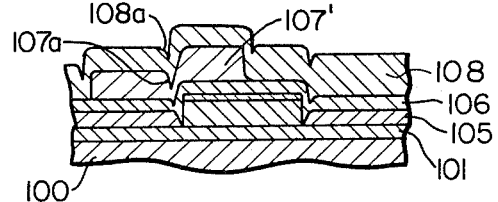

Then, as illustrated in FIG. 2D, a $SiO_2$ layer 106 was formed on the leveled planar surface by sputtering and, as illustrated in FIG. 2E, a permalloy layer 107 was formed on the $SiO_2$ layer 106. After that, as illustrated in FIG. 2F, the permalloy layer 107 was etched to form a predetermined pattern 107' and then, a protecting $SiO_2$ layer 108 was further coated thereon as illustrated in FIG. 2G.

In the above-mentioned conventional pattern-forming process, the $SiO_2$ layer 101 was formed by sputtering to effect planar leveling, but this sputtering required a substantially long time, resulting in a high manufacturing cost. Furthermore, when the manufacturing was conducted by an assembly-line operation, the number of expensive sputtering devices should have corresponded to the number of vacuum sputtering steps in the process, and therefore, a high manufacturing cost could not be avoided. Furthermore, it is to be noted that, when the SiO layer 105 was formed by vapor growth deposition as illustrated in FIG. 2B, the formation of wedge-shaped gaps 102a between the aluminum conductor 102 and the adjacent SiO layer could not be avoided. The gaps 102a lead to contact failure of the conductor with the permalloy. Wedge-shaped gaps 107a and 108a were also formed in the permalloy layer 107 and in the sputtered protecting $SiO_2$ layer 108, respectively. The gap 107a in the permalloy layer 107 influenced the uniformity of the magnetic properties of the resulting device and the gap 108a in the protecting $SiO_2$ layer 108 reduced the moisture resistance of the resulting device.

For eliminating the above-mentioned disadvantages, there has been proposed a process in which planar leveling is performed by coating a thermosetting type polyimide resin. This process, however, is defective in that the magnetic characteristics of permalloy are degraded and the precision of planar leveling is not satisfactory.

In the second half of this example, the manufacture of a magnetic bubble chip according to the present invention is illustrated with reference to FIGS. 3A through 3D.

Figure 3A:
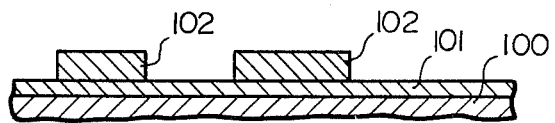
FIGS. 3A through 3D schematically illustrate, in cross-section, the sequential steps of manufacturing a bubble memory device according to the present invention.
Figure 3B:
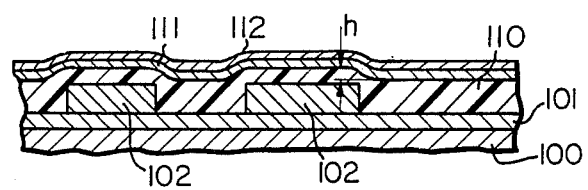
Figure 3C:
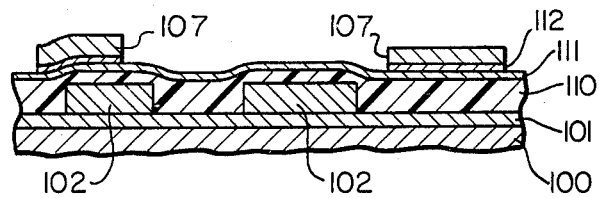

At first, as illustrated in FIG. 3A, $SiO_2$ was coated as an insulating layer 101 on the substrate 100, and a conductor layer 102 of an Al-Cu alloy was formed on this insulating layer 101 by a known lithographic technique. Then, as illustrated in FIG. 3B, a silsesquioxane polymer was spin-coated and, then, cured at 230° C. for one hour in a nitrogen atmosphere, to form a cured silsesquioxane polymer insulating layer 110 having a thickness of 4,000 angstroms.

As the coating solution, solutions of GR100 (manufactured by Owens-Illinois Co.) dissolved in ethyl cellosolve at a concentration of 10 to 30% by weight were used.

Figure 3D:
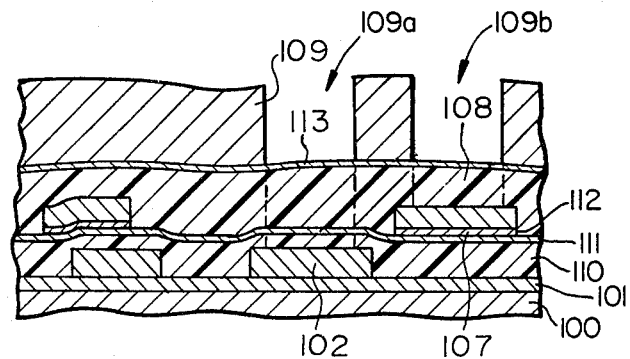

After forming the lager 110, a sputtered $SiO_2$ layer 111 having a thickness of 1,000 angstroms was formed on the cured silsesquioxane polymer layer 110 and, then, a tantalum layer 112 having a thickness of 300 angstroms was formed by the lithographic technique. Then, as illustrated in FIG. 3D, a silsesquioxane polymer layer 108 having a thickness of 10,000 angstroms was formed by coating in the same manner as described above, and a $SiO_2$ layer 113 having a thickness of 0.1 micron was formed thereon. Then, holes for connecting external terminals to the conductor layer 102 and the permalloy layer 107 constituting the detector were formed on the silsesquioxane polymer layers 110 and 108. In this case, as illustrated in FIG. 3D, a resist layer 109 was formed in the region, except for the predetermined positions for formation of the holes, and dry etching was then carried out by using a mixed gas of $CHF_3$ gas and $O_2$ gas (the $O_2$ concentration was higher than 5%). As a result, the silsesquioxane polymer layers were removed to form openings in the areas 109a and 109b indicated by the broken lines in FIG. 3D extending to the layers 102 and 107.

The permalloy layer 107 formed in the above-mentioned process exhibited a Hc of 0.9 oe. For comparison purposes, the above-mentioned procedure was repeated wherein no tantalum layer was formed. The permalloy layer 107 formed in this process exhibited a Hc of 8.4 oe. Furthermore, the above-mentioned procedure was repeated wherein no tantalum layer was formed and the silsesquioxane polymer layer 110 was cured at 450° C. instead of 230° C. In this case, the permalloy layer 107 formed exhibited a Hc of 0.9 oe.

Furthermore, the above-mentioned procedure was repeated wherein the thickness of the $SiO_2$ layer 112 was changed to below 1,000 Angstroms, with all other conditions remaining substantially the same. The resulting permalloy layer 107 formed on the $SiO_2$ layer 112 was undesirably separated when the permalloy layer 107 was connected to an external electrode by means of ultrasonic wire bonding through an opening formed in the silsesquioxane polymer layer 108.

The above-mentioned magnetic bubble device, in which the conductor layer and magnetic substance (permalloy) layer were coated and insulated with a silsesquioxane polymer, could be manufactured in a short time because the area of the $SiO_2$ coating film was small, and degradation of the permalloy by reaction with the silsesquioxane polymer was avoided. Furthermore, when planar leveling was conducted as illustrated in FIG. 3B, even if the average thickness of the silsesquioxane polymer layer 110 was not increased, the step difference "h" could be reduced to a value smaller than the predetermined level. This means that the magnetic coupling between the permalloy layer 107 formed on the silsesquioxane polymer layer 110 and the surface of the substrate 100 was enhanced and the reliability of the operation was improved. Incidentally, when the lamination order of the conductor layer 102 and permalloy layer 107 were reversed, by reducing the thickness of the silsesquioxane polymer layer 110, the magnetic coupling between the conductor layer and the surface of the substrate 100 could be enhanced and the reliability of the operation could similarly be improved.

According to the results of experiments conducted by the present inventors, it was confirmed that, if a thermosetting polyimide resin was coated in an average thickness of 4,000 angstroms on a conductor pattern having a width of 4 microns and a height of 4,000 angstroms, the above-mentioned step difference "h" was as large as 2,800 Anstroms; by contrast, if the above-mentioned GR100 resin was similarly coated, the step difference "h" was as small as 800 Angstroms. That is, the use of the ladder-type silsesquioxane polymer was very advantageous for planar leveling. Furthermore, the use of the silsesquioxane polymer resulted in a bubble memory device exhibiting a satisfactory humidity resistance. The margin of the driving magnetic field was widened by the use of the silsesquioxane polymer.

Although not illustrated in FIG. 3D, a thin $SiO_2$ layer having a thickness of, for example, 0.1 micron may be formed as the uppermost layer by means of sputtering. Due to the formation of the $SiO_2$ layer, the permalloy exhibits a desirably reduced coercive force, e.g. 0.9 oe, after the bubble memory chip is aged at 350° C. for 5 hours in air. By contrast, when the $SiO_2$ layer is not formed, the permalloy exhibits a coercive force of 5.6 oe.

Another advantage of the ladder-type silsesquioxane polymer over the conventional condensation polymerization polyimide resin resides in the fact that the curing temperature of the ladder-type silsesquioxane polymer is lower than that of the polyimide resin. For example, the curing temperature of the above-mentioned GR100 resin is usually 230° C. Therefore, the increase of the coercive force Hc of the permalloy can be minimized.

Still another advantage of the ladder-type silsesquioxane polymer over the polyimide resin resides in the fact that the process of preparing a bubble memory device utilizing the silsesquioxane polymer is simpler and less costly than the process wherein the polyimide resin is utilized. That is, in the case where a magnetic bubble mamory device is manufactured by using the polyimide resin, instead of the silsesquioxane polymer, in a manner similar to that explained with reference to FIGS. 3A through 3D: the insulating layer 101 must be formed from not $SiO_2$ but $Al_2O_3$ by means of sputtering; the surface of the polyimide layer 110 must be roughened by means of plasma asher; and, further, an $Al_2O_3$ layer of at least about 2,000 angstroms in thickness and a Ti or Ta layer of at least about 500 angstroms in thickness must be formed in turn on the polyimide layer 110. The formation of the sputtered $Al_2O_3$ layers requires a longer time (i.e., about four times) than the formation of the sputtered $SiO_2$ layers. Furthermore, it is difficult to provide a protecting polyimide layer. This is because the polyimide coating must be cured at a temperature of at least about 350° C., at which the coercive force of the permalloy is badly influenced. If the polyimide coating is cured at a temperature of lower than 350° C., the cured coating is not satisfactory in humidity resistance.

In the foregoing embodiment, the magnetic bubble device including two silsesquioxame polymer layers, that is, one for planar leveling and the other for protection, has been described. The magnetic bubble device of the present invention is not limited to this type, and many variations and modifications can be made. For example, the silsesquioxane polymer may be used for formation of only one of the above-mentioned two layers. Furthermore, the $SiO_2$ layer 101 formed on the surface of the substrate may be substituted by silsesquioxane polymer layer.

EXAMPLE 6

Examples 6 through 8 illustrate the combined use of a ladder-type silsesquioxane polymer and a polydialkoxysilane or a titanol compound.

A methylphenyl-silsesquioxane Polymer (I-1) having a weight average molecular weight $\overline{M}w$ of 3,000 was used, in which the ratio of methyl groups to phenyl groups was 2/1, and the terminal groups were OH groups. A Polydialkoxysilane (II-1) having ethyl groups and hydrogen atoms as $R^3$ at a ratio of about 1/1 was used. The polydialkoxysilane (II-1) was dissolved in a solvent of n-butyl cellosolve acetate and the concentration was adjusted to 40% by weight. The silsesquioxane polymer (I-1) was used in the form of a n-butyl cellosolve acetate solution having a concentration of 40% by weight. The compounds (I-1) and (II-1) could be mixed at an optional ratio. The mixture was spin-coated on a glass plate, dried at 150° C. for 30 minutes and cured at 350° C., for one hour, in nitrogen. The obtained film was further allowed to stand at a high temperature in N₂ and the change of the film thickness with the lapse of time was examined.

An aluminum layer having a thickness of one micron was formed on the cured film by vacuum evaporation deposition and the adhesion was tested according to the cross-cut adhesion test method. The procedures of this test method were as follows.

(1) On the aluminum layer 100 squares having a side of 1 mm were formed by cross-cutting with a razor (stage A).

(2) An adhesive cellophane tape, with an adhesive force of 50 g/cm at a peeling rate of 1 cm/sec, was applied to the aluminum layer and the tape was then peeled off (stage B).

(3) The film was boiled for one hour in distilled water (stage C).

(4) An adhesive cellophane tape was applied to the aluminum layer and the tape was then peeled off (stage D).

(5) Ultrasonic wave treatment was carried out in distilled water for one hour (stage E).

(6) An adhesive cellophane tape was applied to the aluminum layer and the tape was then peeled off (stage F).

At each stage, the number of remaining squares was counted to evaluate the adhesion.

In the ordinary adhesive tape adhesion test, the adhesion is evaluated at the stage B. It is considered that if a sample shows a satisfactory adhesion at stage F, a high adhesion sufficient to resist an application where a high moisture resistance is required is guaranteed.

Results of the heat resistance (the change of the film thickness) are shown in Table III, below, and results of the adhesion test are shown in Table IV, below.

TABLE III

| Conditions | | Film Thickness Reduction Ratio (%) under High Temperature Standing | | | | | | | | | | |
|---|---|---|---|---|---|---|---|---|---|---|---|---|
| Temperature (°C.) | Time (hr) | Ratio of (I-1)/(I-1) + (II-1) | | | | | | | | | | |
| | | 0 | 0.1 | 0.2 | 0.3 | 0.4 | 0.5 | 0.6 | 0.7 | 0.8 | 0.9 | 1.0 |
| 450 | 1 | 0 | 0 | 0 | — | 0.5 | — | 1 | — | 1 | 2 | 2 |
| 450 | 5 | 0 | 0 | 0 | — | 1 | — | 1 | — | 4 | 5 | 5 |
| 450 | 10 | 0 | 0 | 0 | — | 1 | — | 3 | — | 5 | 5 | 6 |
| 500 | 1 | 0 | 1 | 0.8 | — | 3 | — | 6 | — | 10 | 10 | 11 |
| 500 | 5 | 0 | 1 | 1.2 | — | 5 | — | 8 | — | 14 | 12 | 18 |
| 500 | 10 | 0 | 1 | 1.5 | — | 5 | — | 11 | — | 14 | 16 | 20 |
| 550 | 1 | 0 | 1 | 2 | — | 7 | — | 7 | — | 13 | 16 | 16 |
| 550 | 5 | 0 | 1 | 2 | — | 9 | — | 12 | — | 15 | 18 | 21 |
| 550 | 10 | 0 | 2 | 2 | — | 10 | — | 12 | — | 16 | 18 | 22 |
| Initial film thickness (micron) | | 0.51 | 0.54 | 1.01 | — | 2.10 | — | 1.93 | — | 1.03 | 0.62 | 0.76 |

TABLE IV

| | Adhesion of Aluminum Layer (number of remaining squares) | | | | | | | | | | |
|---|---|---|---|---|---|---|---|---|---|---|---|
| | Ratio of (I-1)/[(I-1) + (II-1)] | | | | | | | | | | |
| Stage | 0 | 0.1 | 0.2 | 0.3 | 0.4 | 0.5 | 0.6 | 0.7 | 0.8 | 0.9 | 1.0 |
| A | 100 | 100 | 100 | — | 100 | — | 100 | — | 100 | 100 | 100 |
| B | 100 | 100 | 100 | — | 100 | — | 100 | — | 100 | 100 | 90 |
| C | 100 | 100 | 100 | — | 100 | — | 100 | — | 100 | 100 | 90 |
| D | 100 | 100 | 100 | — | 100 | — | 100 | — | 100 | 96 | 82 |
| E | 100 | 100 | 100 | — | 100 | — | 100 | — | 100 | 96 | 82 |
| F | 100 | 100 | 100 | — | 98 | — | 100 | — | 98 | 94 | 76 |

EXAMPLE 7

Methyl-silsesquioxane polymer (I-2) having a weight average molecular weight $\overline{M}w$ of 6,500, in which polymer the terminal groups were hydrogen atoms and ethyl groups, and the hydrogen/ethyl ratio was about 1/2, was used in the form of a methyl cellosolve acetate solution having a concentration of 25% by weight. The same polydialkoxy silane (II-1) as that used in Example 6 was used. The curing of the coating film was carried out at 450° C.

The heat resistance and adhesion were tested according to the procedures described in Example 6. Results of the heat resistance test are shown in Table V, below. Results of the adhesion test were substantially the same as those obtained in Example 6.

TABLE V

| Conditions | | Film Thickness Reduction Ratio (%) | | | | | | |
|---|---|---|---|---|---|---|---|---|
| Temperature (°C.) | Time (hr) | Ratio of (I-2)/[(I-2) + (II-1)] | | | | | | |
| | | 0 | 0.2 | 0.4 | 0.6 | 0.8 | 0.9 | 1.0 |
| 500 | 1 | 0 | 0 | 0 | 0 | 0 | 0 | 0 |
| 500 | 4 | 0 | 0 | 0 | 0 | 0 | 0 | 0 |
| 500 | 8 | 0 | 0 | 0 | 0 | 0 | 0 | 0 |
| 600 | 1 | 0 | 0 | 0 | 0 | 1 | 1 | 2 |
| 600 | 4 | 0 | 0 | 0 | 0 | 1 | 3 | 2 |
| 600 | 8 | 0 | 0 | 0 | 0 | 1 | 3 | 2 |
| 650 | 1 | 0 | 0 | 0 | 0 | 1 | 3 | 5 |
| 650 | 4 | 0 | 0 | 0 | 0 | 4 | 3 | 5 |
| 650 | 8 | 0 | 0 | 0 | 0 | 4 | 6 | 9 |
| 700 | 1 | 0 | 1 | 1 | 1 | 3 | 8 | 8 |
| 700 | 4 | 0 | 1 | 1 | 5 | 3 | 8 | 10 |
| 700 | 8 | 0 | 1 | 1 | 6 | 5 | 9 | 11 |
| Initial film thickness (micron) | | 0.50 | 0.92 | 2.15 | 2.30 | 1.56 | 1.43 | 1.11 |

EXAMPLE 8

The silsesquioxane polymer (I-1) described in Example 6 was used in the form of a cyclohexanone solution having a concentration of 30% by weight. A titanol compound (III-1) having butyl groups as $R^4$ was used as the hereinbefore mentioned titanol component [III] in the form of a cyclohexanone solution having a concentration of 20% by weight.

The results obtained were substantially the same as those obtained in Example 6.

EXAMPLE 9

This example illustrates the combined use of a silsesquioxane polymer with a polydiaklkoxysilane for the manufacture of a semiconductor device.

Figure 7:
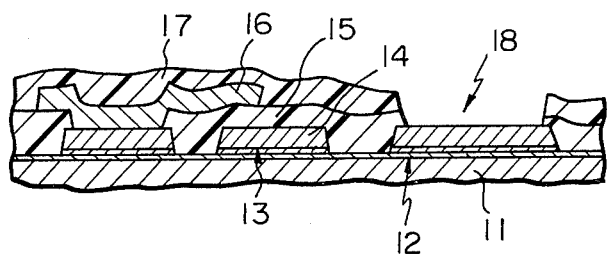
FIG. 7 schematically illustrates, in cross-section, a portion of a semiconductor device according to the present invention.

Methylphenyl-silsesquioxane polymer (I-1) was used, and the polydialkoxysilane (II-1) having as $R^3$ ethyl groups and hydrogen atoms at a ratio of about 1/1 was used as the silanol component [II]. The polymers (I-1) and (II-1) were mixed at a weight ratio of 6/4 to form a resin composition. In this example, this resin composition was used for the manufacture of a semiconductor device having a structure illustrated in FIG. 7.

An $SiO_2$ insulating layer 12, a polysilicone layer 13 and a first aluminum wiring layer 14 were formed in turn on a silicone substrate 11 having semiconductor elements built therein, and the above resin composition [the mixture of (I-1) and (II-1), hereinafter referred to as "R"] was coated thereon to form an R-1 layer 15. The R-1 layer 15 was cured at 450° C. in $N_2$, and a photoresist was coated thereon; patterning of through holes was then carried out and the R-1 layer 15 was subjected to plasma etching by using $CHF_3$—$O_2$ (the $O_2$ concentration being 5%) as a reactive gas. Then, the photoresist was removed by a plasma asher using $O_2$ as a reactive gas.

When the silsesquioxane polymer (I-1) was used alone as the R-I layer, as in the conventional process, cracks were formed on the R-I layer of the polymer (I-1) by $O_2$ plasma. Accordingly, in this case, a layer of $SiO_2$ or the like had to be formed on the layer of the polymer (I-1). Furthermore, the wet etching method had to be adopted for removal of the photoresist.

Then, a second aluminum wiring Al-II layer 16 was formed, and an R-II layer 17 was formed by coating the resin composition R and was then cured. A negative photoresist was coated on the R-II layer 17. After the development, the R-II layer 17, in the area of a window portion for an electrode was etched in the same manner as described above with respect to the R-I layer 15. The negative photoresist was removed by an $O_2$ plasma asher. The R-II layer 17 was not changed by this $O_2$ plasma asher treatment.

EXAMPLE 10

This example illustrates the combined use of a silsesquioxane polymer with a polydialkoxysilane for the manufacture of a magnetic bubble memory device.

Figure 8:
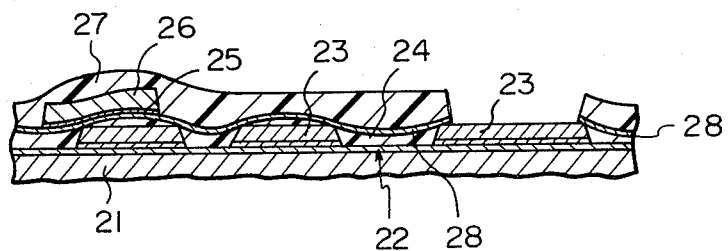
FIG. 8 schematically illustrates, in cross-section, a portion of a magnetic bubble memory device according to the present invention.

Methylphenyl-silsesquioxane polymer (I-1), and a polydialkoxysilane (II-1) having as $R^3$ ethyl groups and hydrogen atoms at a ratio of about 1/1 were mixed at a weight ratio of 6/4. In this example, the so formed resin composition was used for the manufacture of a magnetic bubble device having a structure illustrated in FIG. 8.

An insulating layer 22 of $SiO_2$ was formed on a GGG crystal plate 21 and an aluminum conductor layer 23 of a predetermined pattern was formed thereon. Then, an R-I layer 24 was formed by coating the entire surface with the above-mentioned resin composition and, then, was cured at 350° C. in nitrogen. After that, a $SiO_2$ layer 28 was formed on the entire surface and, then, a tantalum layer 25 and a permalloy layer 26 were in turn formed. Then, an R-II layer 27 was further formed by using the above-mentioned resin composition. A positive photoresist was applied to the R-I layer 24 and R-II layer 27, and they were etched according to the dry etching method and the photoresist was removed. Methyl cellosolve acetate was used for formation of coating solutions of the above-mentioned resin composition, which were used for formation of the R-I layer 24 and R-II layer 27. The concentrations of the polymer in the coating solutions used for formation of the R-I layer 24 and R-II layer 27 were 20% and 38%, respectively, by weight.

In this example, wherein a mixture of the silsesquioxane polymer and the polydialkoxysilane was used, at least 300 Angstroms of the thickness was necessary for the $SiO_2$ layer 28. This is in a striking contrast to Example 5, utilizing only the silsesquioxane polymer, wherein at least 1,000 Angstroms of the thickness was necessary for the $SiO_2$ layer 28.

EXAMPLE 11

A monomethyl silsesquioxane polymer having a weight average molecular weight of 60,000 was dissolved in a mixed solvent of xylene, toluene and isophorone to obtain a solution having a concentration of 18% by weight. A polydialkoxysilane was dissolved in a mixed solvent of ethanol, isopropyl alcohol and diacetone alcohol to obtain a solution having a concentration of 10% by weight. Tetrabutyl titanium was dissolved in cyclohexanone to obtain a solution having a concentration of 30% by weight.

The monomethyl silsesquioxane polymer solution was spin-coated on a substrate having an aluminum pattern having a thickness of 4,000 Angstroms to form a monomethyl silsesquioxane polymer coating layer having an average thickness of 4,100 Angstroms. This layer was dried at 100° C. for 30 minutes and cured at 450° C., for 1 hour, in nitrogen.

From the so-prepared laminate, the following laminated multi-layer structures were prepared:

Sample 1

No layer was formed on the above mentioned laminate. Namely, the sample had a laminate structure of substrate/aluminum pattern/ladder-type silsesquioxane polymer layer.

Sample 2

The above-mentioned polydialkoxysilane solution was coated in a thickness of 100 to 10,000 angstroms. Namely, the sample had a laminate structure of substrate/aluminum pattern/ladder-type silsesquioxane polymer layer/polydialkoxysilane layer.

Sample 3

The above-mentioned tetrabutyl titanium solution was coated in a thickness of 100 to 1,350 Angstroms. Namely, the sample had a laminate structure of substrate/aluminum pattern/ladder-type silsesquioxane polymer layer/titanol resin layer.

In the case of the samples 2 and 3, the solutions were spin-coated and the coatings were pre-cured at 100° C. for 30 minutes, and further, at 170° C. for 30 minutes, and then cured at 450° C., for 1 hour, in nitrogen.

An aluminum layer having a thickness of 10,000 Angstroms by vacuum evaporation deposition, an SiO$_2$ layer having a thickness of 10,000 Angstrom by sputtering and a PSG layer having a thickness of 10,000 Angstroms by gas phase growth at 450° C. were separately formed on each of the above samples 1, 2 and 3. The adhesions of the aluminum layer, SiO$_2$ layer, and PSG layer to the substrate laminates were evaluated according to the following test method.

One hundred squares having a side of 1 mm were formed on the top layer film by cross-cutting with a razor. Then, the sample was boiled in distilled water for 1 hour. After that, an adhesive cellophane tape was applied to the sample and was then peeled. The adhesion was evaluated based on the number of squares of the Al, SiO$_2$ or PSG film left on the substrate laminate. The obtained results are shown in the Table VI, below.

TABLE VI

| Top Layer | Sample 1 | Substrate Laminate Sample 2 | | | | | | Sample 3 | | | |
|---|---|---|---|---|---|---|---|---|---|---|---|
| | | 100Å | 300Å | 1000Å | 3000Å | 6000Å | 10000Å | 100Å | 500Å | 1200Å | 1350Å |
| Aluminum film | 82 | 98 | 100 | 100 | 100 | 100*4 | *2 | 100 | 100 | 100 | *3 |
| SiO$_2$ film | 54 | 85 | 92 | 100 | 100 | 100*4 | — | 90 | 100 | 100 | — |
| PSG film | *1 | — | — | 100 | — | — | — | — | — | — | — |

Note
*1 cracks were formed in the silsesquioxane polymer layer
*2 cracks were formed in the polydialkoxysilane layer
*3 cracks were formed in the titanol resin layer
*4 cracks were formed in the polydialkoxy silane layer although only to a slight extent.

As will be apparent from the results shown in Table VI, if a layer of a silanol resin (polydialkoxysilane) or titanol resin is formed as an interposing layer on a ladder-type silsesquioxane polymer layer, the adhesion of a top layer to be formed on the silsesquioxane polymer layer can be remarkably improved. This is because the polydialkoxysilane and the titanol resin are converted to silicon oxide and titanium oxide, respectively, after the curing, and these oxides exhibit good adhesion to the top layer.

When a PSG film is formed by the vapor phase growth in the manufacture of a semiconductor device or the like, a wafer is placed in air maintained at 450° C. and, then, a PSG film is formed. Due to this exposure of the wafer to the high temperature air, the silsesquioxane polymer reacts with oxygen and the surface of the polymer layer tends to crack. This disadvantage can be overcome if a laminate structure prepared by forming a silanol resin or titanol resin layer on the silsesquioxane polymer layer, for example, the sample 2 or 3 shown in the above table, is used. By interposing this silanol or titanol resin between the silsesquioxane polymer layer and the top layer, the adhesions of both the silsesquioxane polymer layer and top layer can be improved, and the formation of cracks in the surface of the lower silsesquioxane polymer substrate layer can be prevented.

EXAMPLE 12

Figure 10B:
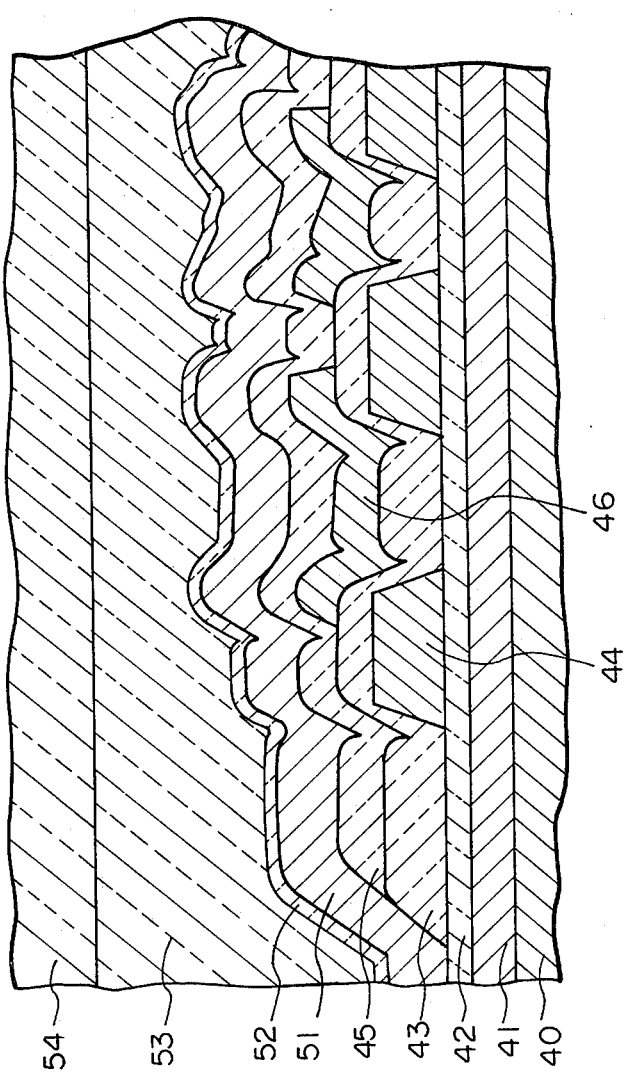
FIG. 10A schematically illustrates, in cross-section, a portion of a thin film magnetic head according to the present invention; and, FIG. 10B schematically illustrates, in cross-section, a portion of a thin film magnetic head according to prior art.

This example illustrates the manufacture of a magnetic head with reference to FIG. 10A and FIG. 10B (prior art).

Referring to FIG. 10A, a permalloy layer 41 of 3 microns in thickness was formed on a mirror polished Fotoceram substrate 40 by means of sputtering, followed by patterning the permalloy 41. A SiO$_2$ layer 42 of one micron in thickness was formed on the permalloy layer 41. A solution of a mixture of 6 parts by weight of methylsilsesquioxane polymer and 4 parts by weight of polydiethoxysilane in methyl cellosolve acetate was spin-coated on the SiO$_2$ layer. The so-formed silsesquioxane polymer coating was pre-cured at 100° C. for 30 minutes and, then, cured at 450° C. for 60 minutes to obtain an insulation layer 55. After that, an Al-Cu conductor coil 44 of 2.5 microns in thickness was formed on the cured polymer layer 55. A SiO$_2$ layer 43 of one micron thickness was formed on the conductor coil 44 by means of sputtering. Again, a silsesquioxane polymer insulation layer 47 was formed in a manner similar to that for the preparation of the insulation layer 55. The amount of the silsesquioxane polymer used was such that the coating thickness of one micron was obtained if the silsesquioxane polymer was coated on a flat plate. Then, a SiO$_2$ layer 45 of 0.1 micron thickness was formed on the insulation layer 47. After through-holes for the connection of coils were formed in the layers 45 and 47, an Al-Cu conductor coil 46 of 2.5 microns in thickness was formed and, then, a silsesquioxane polymer insulation layer 48 was formed. The coating thickness of the silsesquioxane polymer in the layer 48 was similar to that in the layer 47. Thereafter, the silsesquioxane polymer layers 55, 47 and 48 and the SiO$_2$ layers 42, 43 and 45 were taper-etched. Then, a SiO$_2$ layer 49 of one micron thickness, a tantalum layer 50 of 0.1 micron thickness, a permalloy layer 51 of three microns thickness and, then, a SiO$_2$ layer 52 of one micron thickness were in turn formed. After that, a glass plate 54 of 300 microns thickness was bonded to the uppermost SiO$_2$ layer 52 at a temperature of 480° C. by using a binder 53 of a low melting point glass (having a melting point of 380° to 400° C.).

When the glass plate 54 was bonded at 480° C., neither voids nor cracks formed in the cured silsesquioxane polymer layers 55, 47 and 48, and these polymer layers were not separated from the adjacent layers. The cured silsesquioxane polymer layers 47 and 48 exhibited excellent levelling properties.

For comparison purposes, the above-mentioned procedure was repeated wherein no silsesquioxane polymer was used, to prepare a magnetic head having a multilayer wiring structure illustrated in FIG. 10B. The magnetic head comprised a Fotoceram substrate 40, a permalloy layer 41, a SiO$_2$ layer 42, an Al-Cu conductor coil 44, a SiO$_2$ layer 43, an Al-Cu conductor coil 46, a SiO$_2$ layer 45, a permalloy layer 51, a SiO$_2$ layer 52, a low melting point glass adhesive layer 53 and a glass plate 54. In the preparation of the above-mentioned magnetic head, the degree of accuracy in photoetching steps was not satisfactory. This is because the SiO$_2$ layers exhibited no levelling effect on a pattern.

Furthermore, the procedure mentioned with reference to FIG. 10A was repeated wherein a condensation polymerization-type polyimide resin was used instead of the silsesquioxane polymer.

When the glass plate 54 was bonded at a temperature of at least about 420° C., the low melting point glass binder exhibited good adhesion but voids were formed in the polyimide layers. At the bonding temperature of 400° C., no voids were formed in the polyimide layers but the adhesion of the low melting point glass binder was not satisfactory. In order to enhance the adhesion of the low melting point glass binder, an aluminum layer and an alumina layer were formed between the respective polyimide layers and the adjacent SiO$_2$ layers, but good adhesion could not be obtained without the formation of voids in the polyimide layers.

EXAMPLE 13

This example illustrates the combined use of a silsesquioxane polymer with a polydialkoxysilane for the manufacture of a magnetic bubble memory device. The procedure employed in this example is a modification of those employed in Examples 5 and 10.

Methylphenyl-silsesquioxane polymer (I-1) and a polydialkoxysilane (II-1) having as R$^3$, ethyl groups and hydrogen atoms at a ratio of about 1/1, were mixed at a weight ratio of 5/5. In this example, the so-formed resin composition was used for the manufacture of a magnetic bubble device having a structure illustrated in FIG. 8. An insulating layer 22 of SiO$_2$ was formed on a GGG crystal plate 21, and a Mo/Au/Mo conductor layer 23 of a predetermined line-and-space pattern was formed thereon by means of vapor deposition using an electron beam gun. The widths of each line and each space were two microns and one micron, respectively. The bubble diameter was 1.5 microns. Then, an R-I layer 24 was formed by coating the entire surface with the above-mentioned resin composition and was, then, cured at a temperature of 550° C. in air, for one hour. After that, a SiO$_2$ layer 28 was formed on the entire surface, and then, a permalloy layer 26 was formed. Then, an R-II layer 27 was further formed by using the above resin composition. The curing of the R-II layer 27 was carried out at 275° C. in nitrogen, for one hour. A positive photoresist was applied to the R-I layer 24 and R-II layer 27, and they were etched according to the dry etching method and the photoresist was removed. Methyl cellosolve acetate was used for formation of coating solutions of the above mentioned resin composition, which were used for formation of the R-I layer 24 and R-II layer 27. The concentrations of the polymer in the coating solutions used for formation of the R-I layer 24 and R-II layer 27 were 20% and 38%, respectively, by weight.

It is to be noted that, when the silsesquioxane polymer used in Example 5 was cured under the same conditions as mentioned above, the layer of the polymer cracked.

Furthermore, it is to be noted that, although the formation of the tantalum layer 25 was necessary in Examples 5 and 10, the formation of the tantalum layer 25 could be omitted in Example 13. That is, the magnetic properties of the permalloy were satisfactory even without the tantalum layer 25 in Example 13. This is because a Mo/Au/Mo conductor was used as the metal conductor and hence, the R-I layer 24 could be cured at a temperature of 550° C.

It has now been found that, if a thin SiO$_2$ layer having a thickness of 0.1 micron is formed on the cured R-II layer 27, the permalloy is not oxidized even when the element is aged at a temperature of 350° C., in air, for 5 hours. Thus, the thermal resistance of the device can be enhanced.

When a bonding wire was attached through a window to the permalloy of the device obtained in this example, by means of ultrasonic wave bonding, no undesirable separation of the permalloy was observed. In contrast, in the case of the device obtained in Example 5, the separation of the permalloy occurred at a rate of 15%.

We claim:

1. An electronic device having a multilayer wiring structure comprising:
   a substrate having formed thereon a first metal wiring layer, and;
   an interlayer insulation layer comprised of a cured coating of a ladder-type silsesquioxane polymer, formed on the substrate and on said first metal wiring layer and having formed thereon a second metal wiring layer.

2. An electronic device having a structure of multiple wiring layers comprising:
   a layer for protecting each metal wiring layer formed in the multiple layer wiring structure;
   said protecting layer being comprised of a cured coating of a ladder-type silsesquioxane polymer.

3. The electronic device according to claim 1 or 2, wherein the ladder-type silsesquioxane polymer has a chemical structure represented by the formula:

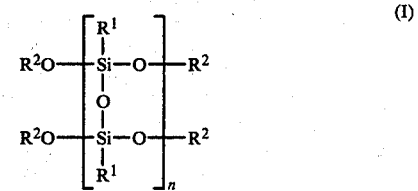

wherein each R$^2$ is independently hydrogen, methyl, ethyl or propyl, each R$^1$ is independently methyl, ethyl, phenyl, chlorophenyl or bromophenyl, and part of the R$^1$ groups may be replaced by hydroxyl, methoxy or ethoxy, and n is an integer sufficient to provide a molecular weight of from about 1,000 to about 1,000,000.

4. The electronic device according to claim 3, wherein at least one half of the side chains R$^1$ are methyl groups and the remainder of the side chains R$^1$ are selected from ethyl, phenyl, chlorophenyl, hydroxyl, methoxy and ethoxy groups.

5. The electronic device according to claim 3, wherein all of the side chains R$^1$ are methyl groups, or at least one half of the side chains R$^1$ are methyl groups and the remainder of the side chains R$^1$ are phenyl groups.

6. The electronic device according to claim 3, wherein n in the formula (I) is an integer sufficient to provide a molecular weight of from about 1,500 to about 200,000.

7. The electronic device according to claim 1 or 2, wherein said interlayer insulation layer or protecting layer comprises a cured coating of a mixture comprising at least 30% by weight of the ladder-type silsesquioxane polymer and not larger than 70% by weight of at least one compound selected from the group consisting of:
   (i) silanol compounds represented by the following formula (II) or (IV):

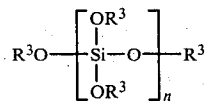

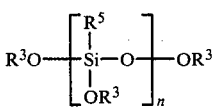

wherein each R³ is independently hydrogen or an alkyl group having 1 to 3 carbon atoms and R⁵ is an organic residue; and (ii) titanol compounds represented by the following formula:

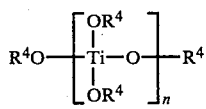

wherein each R⁴ is independently an alkyl group having 3 to 6 carbon atoms.

8. The electronic device according to claim 7, wherein said mixture comprises 40 to 70% by weight of the ladder-type silsesquioxane polymer and 30% to 60% by weight of said compound selected from silanol compounds of the formula (II) or (IV) and titanol compounds of the formula (III).

9. The electronic device according to claim 1 or 2, wherein said interlayer insulation layer or protecting layer is a cured coating of a copolymer comprised of at least 30% by weight of units derived from the ladder-type silsesquioxane polymer and not larger than 70% by weight of units drived from at least one compound selected from the group consisting of:

(i) silanol compounds represented by the following formula (II) or (IV):

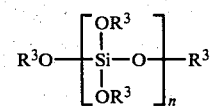

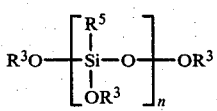

wherein each R³ is independently hydrogen or an alkyl group having 1 to 3 carbon atoms and R⁵ is an organic residue; and (ii) titanol compounds represented by the following formula:

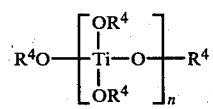

wherein each R⁴ is independently an alkyl group having 3 to 6 carbon atoms.

10. The electronic device according to claim 9, wherein said copolymer is comprised of at least 80% by weight of the ladder-type silsesquioxane polymer units and not larger than 20% by weight of the silanol or titanol compound units.

11. The electronic device according to claim 1 or 2, wherein said interlayer insulation layer or protecting layer is a cured coating of a copolymer mixture comprising:

(i) a copolymer comprised of at least 80% by weight of units derived from the ladder-type silsesquioxane polymer and not larger than 20% by weight of units derived from at least one compound selected from the group consisting of:

(a) silanol compounds represented by the following formula (II) or (IV):

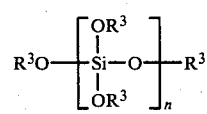

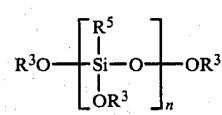

wherein each R³ is independently hydrogen or an alkyl group having 1 to 3 carbon atoms and R⁵ is an organic residue; and (b) titanol compounds represented by the following formula:

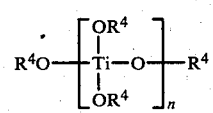

wherein each R⁴ is independently an alkyl group having 3 to 6 carbon atoms; and, (ii) at least one compound of the silanol and titanol compounds of the formulae (II), (IV) and (III), the amount of the compound (ii) selected from the silanol and titanol compounds being such that the total amount of the compound (ii) to be mixed with the copolymer (i) and the silanol or titanol compound contained in the copolymer (i) is not larger than 70% by weight based on the weight of the copolymer mixture.

12. The electronic device according to claim 7, wherein R⁵ in the formula (IV) is an alkyl group having 1 to 6 carbon atoms, an alkenyl group having 2 to 6 carbon atoms or a substituted or unsubstituted phenyl group.

13. The electronic device according to claim 7, wherein said electronic device is a semiconductor device and said interlayer insulation layer contains 100 to 50,000 ppm of phosphorus.

14. An electronic device according to claim 1 wherein the electronic device is a semiconductor device, and wherein:

said substrate has built-in circuit elements thereon, predetermined portions of said circuit elements being exposed, said first metal wiring layer being formed in a predetermined pattern on said substrate on the surface thereof having said built-in circuit elements and selectively contacting said predetermined, exposed portions thereof;

said interlayer insulation layer having at least one window therein aligned with a predetermined, corresponding portion of said first metal wiring layer, and said second metal wiring layer being formed in a predetermined pattern formed on said interlayer insulation layer and extending through said at least one window into electrical contact with said corresponding, predetermined portion of said first metal wiring layer.

15. The electronic device according to claim 1 wherein:
at least one of the first and second metal wiring layers comprises a magnetic material, and there is further provided
a further layer formed between the magnetic material metal wiring layer and said interlayer insulation layer, said further layer being formed of a material selected from the group consisting of:
(i) at least one inorganic oxide selected from the group consisting of $SiO_2$, $Al_2O_3$, $Cr_2O_3$, and $TiO_2$, and
(ii) at least one inorganic oxide selected from the group consisting of $SiO_2$, $Al_2O_3$, $Cr_2O_3$, and $TiO_2$ and an additional layer of a material selected from the group consisting of tantalum or titanium.

16. The electronic device according to claim 1 comprising a magnetic bubble device, and wherein:
said first metal wiring layer is formed on said substrate in a predetermined pattern, and
said second metal wiring layer comprises a permalloy layer formed in a predetermined pattern on said interlayer insulation layer.

17. The electronic device according to claim 1, wherein said electronic device comprises a magnetic head and wherein each of said first and second metal wiring layers comprises a soft magnetic material, said soft magnetic material of said layers being patterned to define a conductor coil, and
a plurality of insulation layers, at least one of said insulation layers comprising a cured coating of a ladder-type silsesquioxane polymer.

18. The electronic device according to any of claims 1, 14, 16, or 17, further comprising:
an adhesion layer comprised of at least one oxide selected from the group consisting of $SiO_2$, $Al_2O_3$, $Cr_2O_3$, and $TiO_2$ between said interlayer insulation layer comprised of the cured ladder-type silsesquioxane polymer and said second metal layer.

19. The electronic device according to claim 1 further comprising:
a layer of an inorganic oxide formed in proximate and contiguous relationship to at least one of said first and second metal wiring layers by vapor phase growth deposition and forming wedge-shaped gaps between contiguous edges of said inorganic oxide layer and said metal wiring layer, and
said ladder-type silsesquioxane polymer material of said interlayer insulation layer filling said gaps.

20. The electronic device according to claims 1 or 2, further comprising:
a layer of inorganic oxide material selected from the group consisting of $SiO_2$, $Al_2O_3$, $Cr_2O_3$ and $TiO_2$ formed as the uppermost layer of the multiple wiring structure.

* * * * *

UNITED STATES PATENT AND TRADEMARK OFFICE
CERTIFICATE OF CORRECTION

PATENT NO. : 4,349,609

DATED : September 14, 1982

INVENTOR(S) : Shiro Takeda et al.

It is certified that error appears in the above-identified patent and that said Letters Patent is hereby corrected as shown below:

Col. 3, line 67, after "1;" insert --and--;

Col. 6, line 19, after "is," insert --each--;

line 33, after "conductor" insert --,--;

Col. 7, line 6, "oxigen" should be --oxygen--;

line 62, "hereinbeforementioned" should be --hereinbefore-mentioned--;

Col. 8, line 44, delete "film 2 in the";

line 45, after "the" insert --film 2 in the--;

Col. 10, line 5, under subheading "Substituents" insert --$CH_3$--;

Col. 11, line 47, "35" should be --36--;

UNITED STATES PATENT AND TRADEMARK OFFICE
CERTIFICATE OF CORRECTION

PATENT NO. : 4,349,609

DATED : September 14, 1982

INVENTOR(S) : Shiro Takeda et al.

It is certified that error appears in the above-identified patent and that said Letters Patent is hereby corrected as shown below:

Col. 12, line 58, "lager" should be --layer--;

Col. 14, line 24, "mamory" should be --memory--;

Col. 16, line 2, delete "," (first occurrence);

Signed and Sealed this

Seventeenth Day of May 1983

[SEAL]

Attest:

DONALD J. QUIGG

Attesting Officer     Acting Commissioner of Patents and Trademarks